United States Patent [19]

Yang

[11] Patent Number: 5,206,460

[45] Date of Patent: Apr. 27, 1993

[54] OSCILLATOR PACKAGE

[76] Inventor: Mu K. Yang, 4Fl., No. 85, Yenping S. Rd., Taipei, Taiwan

[21] Appl. No.: 734,902

[22] Filed: Jul. 24, 1991

[51] Int. Cl.⁵ .................. H05K 5/00; H01L 23/02
[52] U.S. Cl. ................... 174/52.1; 174/52.4; 174/52.5; 361/390; 257/924
[58] Field of Search ............ 357/74, 80; 174/52.1, 174/52.4, 52.5; 361/380, 390, 392, 394, 404

[56] References Cited

U.S. PATENT DOCUMENTS

| | | | |
|---|---|---|---|
| 4,152,616 | 5/1979 | Ozbirn et al. | 174/52.5 |
| 4,208,698 | 6/1980 | Narasimhan | 361/414 |
| 4,338,621 | 7/1982 | Braun | 357/74 |
| 4,382,327 | 5/1983 | Bardens et al. | 29/588 |
| 4,951,011 | 8/1990 | Heckaman et al. | 333/33 |
| 5,018,004 | 5/1991 | Okinaga et al. | 357/74 |
| 5,093,282 | 3/1992 | Ohno et al. | 437/221 |

Primary Examiner—Leo P. Picard
Assistant Examiner—Bot Ledynh
Attorney, Agent, or Firm—Wolf, Greenfield & Sacks

[57] ABSTRACT

An oscillator package includes a header substrate with a number of through holes formed therein, a copper post passed through each through hole, a ceramic substrate securely mounted to and supported by the copper posts for mounting a die and a crystal thereon, a substantially L-shaped lead securely attached to an underside as well as a lateral side of the header substrate and contacting each copper post, and a ceramic cover housing the die and crystal. A metal film is applied to an inner periphery of the hole, and the copper posts are mounted in the holes after the metal-film is sintered. An outer periphery of the copper post is plated by nickel then gold. The lead is mountable to a circuit board by soldering, and the solder covers an overall area of the lead. The ceramic cover has at least a 90% weight of aluminum oxide.

6 Claims, 2 Drawing Sheets

OSCILLATOR PACKAGE

BACKGROUND OF THE INVENTION

The present invention relates to an improved oscillator package, and more particularly to an improved oscillator package which can be mounted on a circuit board by surface mounting technique (SMT).

Traditionally, oscillators are packaged by metallic housings, and thus cannot be mounted on circuit boards by SMT since the metallic housings might cause a short circuit. A small outline molding technique has been proposed to obviate the above-mentioned problem, so as to allow the oscillators to be mounted on the circuit boards by SMT, which is currently and widely adopted.

In the field of small outline molding technique, a current process packages an oscillator by a plastic housing, which is compatible with SMT. Nevertheless, in the oscillator, the crystal must be housed in a cylindrical metallic housing since the plastic housing is not hermetic. The available frequencies provided by oscillators packaged this way are restricted to a small range since standard disk-type so-called AT cut crystals are not suitable; and only strip-type crystals can be used. Moreover, the cost for high frequency parts is significantly raised since oscillation cannot be generated by overtone.

Another current process, a so-called Multi-Layer Cofire process, for SMT clock oscillators utilizes a chip carrier and a Kovar lid to package the oscillator, and the package is sealed by a gold-tin alloy thereafter. However, such a process is extremely expensive.

The present invention provides an improved oscillator package to mitigate and/or obviate the aforementioned problems.

SUMMARY OF THE INVENTION

It is an object of the present invention to provide an improved oscillator package which is compatible with surface mounting technique.

It is another object of the present invention to provided an improved oscillator package which is low in cost.

It is still another object of the present invention to provide an improved oscillator package which has a good quality in air tightness.

It is yet another object of the present invention to provide an improved oscillator package which can endure high temperatures.

It is still another object of the present invention to provide an improved oscillator package in which various frequencies can be obtained by a selection of different crystals.

Other objects, advantages, and novel features of the invention will become more apparent from the following detailed description when taken in conjunction with the accompanying drawings.

DETAILED DESCRIPTION OF THE PREFERRED EMBODIMENTS

Figure 1:
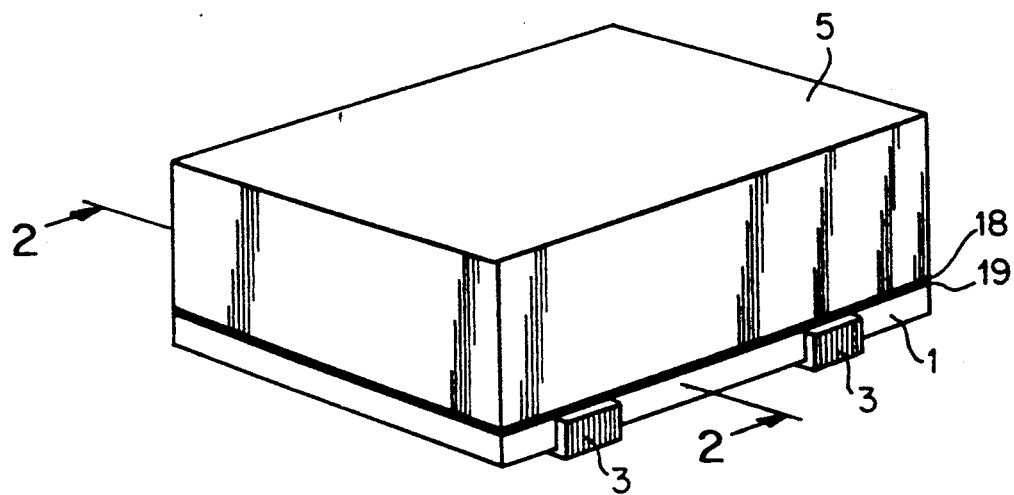
FIG. 1 is a perspective view showing an oscillator package according to the present invention.
Figure 2:
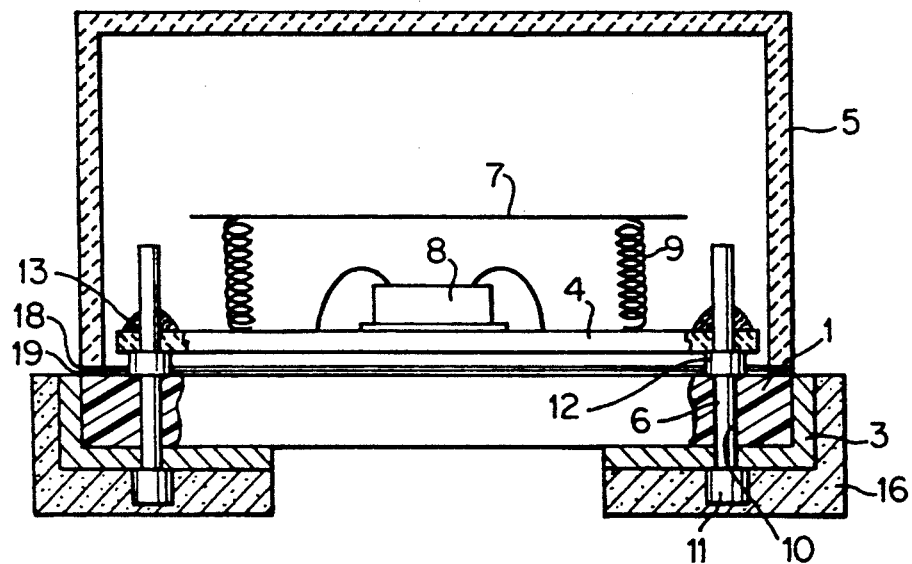
FIG. 2 is a cross-sectional view taken along line 2—2 in FIG. 1.
Figure 3:
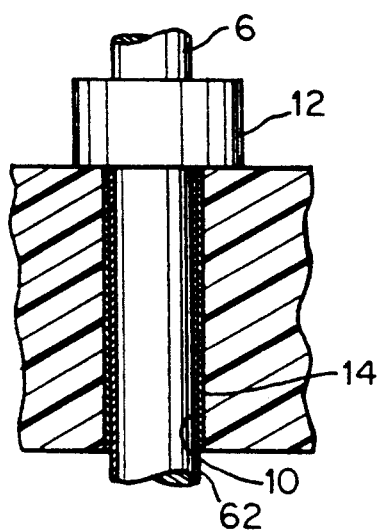
FIG. 3 is an enlarged schematic view showing the detailed arrangement of the copper post and the hole.

Referring to FIGS. 1 and 2, an oscillator package according to the present invention comprises a header substrate 1 and a ceramic cover 5. A plurality of through holes 10 are formed in the header substrate 1 each for receiving a copper post 6. A film of metal 14 is applied to a periphery of each hole 10 by a known thick-film method. After the metal film is sintered, a copper post 6 is provided in each hole 10 for supporting a ceramic substrate 4 on which a die 8 is mounted by wire bonding. An outer periphery of the copper post 6 is plated with nickel and then gold. In this embodiment, the copper post 6 combines the metal film on the periphery of the hole 10 by spot soldering to form an alloy, so as to be used as a pin and to provide high-quality hermeticity.

A substantially L-shaped lead 3 is provided on an underside of the header substrate 1 and a lateral side of the header substrate 1, each contacting one of the copper posts 10. The lead 3 is mounted on a circuit board (not shown) by soldering. A first flange 11 is formed at a lower end of the copper post 6. Provision of a flange 11 of the copper post 6 results in that the tin solder 16 can be formed on the underside and the lateral side of the lead 3, such that the quality of the solder can be conveniently examined from the lateral side. Referring to FIG. 2, after soldering, the solder forms a substantially L-shaped structure which covers an overall area of the lead, including the lateral side thereof, for convenient examination of the quality of the tin.

As can be seen in FIG. 2, the ceramic substrate 4 is mounted above the header substrate 1 by a second flange 12 of each of the copper posts 6. The die 8 is mounted on the ceramic substrate 4 by wire bonding, and a crystal 7 is supported by two springs 9, which are also mounted on the ceramic substrate 4, whose detailed structure and function are too conventional that no further description is required. The ceramic substrate 4 is securely affixed to the copper posts 10 by solder 13 or similar method.

A ceramic cover 5, with at least 90% weight of aluminum oxide ($Al_2O_3$), is provided on the header substrate 1 to seal the whole structure. An underside of a perimeter of the ceramic cover 5 is covered by a thick film paste 18 with a high-temperature solder coating 19 such that the ceramic cover 5 securely and sealingly engages with an upper surface of the header substrate 4 after a solder reflow process.

According to the above, it is understood that the present invention has the following advantages:

1. The present invention is economical and is easy to put into use since it utilizes aluminum oxide ($Al_2O_3$) as the essential material of the ceramic cover.

2. The present invention uses spot soldering technique to form an alloy which possesses high-quality hermeticity.

3. The ceramic cover of the present invention can endure temperatures higher than 280° C.

4. Traditional disc-type crystals can be used in the present oscillator package.

5. The pin and lead frame structure of the present invention can be soldered on a circuit board by a surface mounting process without the disadvantage of conventional through hole techniques.

6. The oscillators in accordance with the present invention provide a great variety of frequencies.

Although the invention has been explained in relation to its preferred embodiment, it is to be understood that many other possible modifications and variations can be made without departing the spirit and scope of the invention as hereinafter claimed.

I claim:

1. An oscillator package capable of being mounted on a circuit board by surface mounting technique, comprising:

a header substrate with a plurality of through holes formed therein;

a copper post passed through each said through hole, each said copper post having a first flange formed at an underside of said header substrate and a second flange formed at an upper side of said header substrate;

a ceramic substrate securely mounted to and supported by said second flanges of said copper posts for mounting a die thereon;

a substantially L-shaped lead securely attached to an underside as well as a lateral side of said header substrate, contacting each copper post, such that said first flange is at an underside of said L-shaped lead; and a ceramic cover provided on an upper side of said header substrate for housing and sealing said die and said crystal.

2. The oscillator package as claimed in claim 1, wherein a metal film is applied to an inner periphery of said hole by a thick-film method, said copper post is securely mounted in said hole after said metal-film is sintered.

3. The oscillator package as claimed in claim 2, wherein an outer periphery of said copper post is covered by a nickel-gold alloy.

4. The oscillator package as claimed in claim 1, wherein said lead is mounted to the circuit board by soldering, and a tin solder for soldering covers an overall area of said lead.

5. The oscillator package as claimed in claim 1, wherein said ceramic cover has at least a 90% weight of aluminum oxide.

6. The oscillator package as claimed in claim 1, wherein a thick film paste with a solder coating is provided on a periphery of an underside of said ceramic cover which contacts an upper surface of said header substrate for sealing.

* * * * *